United States Patent
Davis et al.

(10) Patent No.: US 9,373,636 B2
(45) Date of Patent: Jun. 21, 2016

(54) METHODS OF FORMING SEMICONDUCTOR CONSTRUCTIONS

(71) Applicant: Micron Technology, Inc., Boise, ID (US)

(72) Inventors: Neal L. Davis, Boise, ID (US); David A. Kewley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/930,504

(22) Filed: Nov. 2, 2015

(65) Prior Publication Data

US 2016/0071878 A1  Mar. 10, 2016

Related U.S. Application Data

(62) Division of application No. 13/675,933, filed on Nov. 13, 2012, now Pat. No. 9,178,077.

(51) Int. Cl.
    *H01L 21/336* (2006.01)
    *H01L 27/115* (2006.01)

(52) U.S. Cl.
    CPC ...... *H01L 27/11582* (2013.01); *H01L 27/1157* (2013.01); *H01L 27/11524* (2013.01); *H01L 27/11556* (2013.01)

(58) Field of Classification Search
    CPC .................................................. H01L 21/336
    See application file for complete search history.

(56) References Cited

U.S. PATENT DOCUMENTS

| 6,057,193 | A  | 5/2000  | Wang et al. |
|-----------|----|---------|-------------|
| 6,063,666 | A  | 5/2000  | Chang et al. |
| 6,143,604 | A  | 11/2000 | Chieng et al. |
| 6,180,454 | B1 | 1/2001  | Chang et al. |
| 6,274,471 | B1 | 8/2001  | Huang |
| 6,353,242 | B1 | 3/2002  | Watanabe et al. |
| 6,661,691 | B2 | 12/2003 | Fricke et al. |
| 6,803,318 | B1 | 10/2004 | Qiao et al. |
| 7,112,488 | B2 | 9/2006  | Helm et al. |

(Continued)

FOREIGN PATENT DOCUMENTS

| KR | 10-2011-0000487 | 1/2011 |
| KR | 10-2011-0120654 | 11/2011 |

(Continued)

OTHER PUBLICATIONS

WO PCT/US2013/063302 Search Rept., Jan. 15, 2014, Micron Technology, Inc.

(Continued)

*Primary Examiner* — Marvin Payen
(74) *Attorney, Agent, or Firm* — Wells St. John P.S.

(57) ABSTRACT

Some embodiments include a semiconductor construction having a stack containing alternating levels of control gate material and intervening dielectric material. A channel material panel extends through the stack and along a first direction. The panel divides the stack into a first section on a first side of the panel and a second section on a second side of the panel. Memory cell stacks are between the channel material panel and the control gate material. The memory cell stacks include cell dielectric material shaped as containers having open ends pointing toward the channel material panel, and include charge-storage material within the containers. Some embodiments include methods of forming semiconductor constructions.

20 Claims, 10 Drawing Sheets

(56) References Cited

U.S. PATENT DOCUMENTS

| | | |
|---|---|---|
| 7,112,490 B1 | 9/2006 | Hong et al. |
| 7,196,004 B2 | 3/2007 | Lee et al. |
| 7,419,895 B2 | 9/2008 | Lindsay |
| 7,713,819 B2 | 5/2010 | Okajima |
| 7,790,360 B2 | 9/2010 | Alapati et al. |
| 7,829,935 B2 | 11/2010 | Makihara et al. |
| 7,898,856 B2 | 3/2011 | Aritome |
| 7,906,818 B2 | 3/2011 | Pekny |
| 7,968,406 B2 | 6/2011 | Ramaswamy et al. |
| 8,148,216 B2 | 4/2012 | Arai et al. |
| 8,183,110 B2 | 5/2012 | Ramaswamy et al. |
| 8,187,938 B2 | 5/2012 | Lim et al. |
| 8,207,570 B2 | 6/2012 | Alapati et al. |
| 8,228,743 B2 | 7/2012 | Min et al. |
| 8,237,213 B2 | 8/2012 | Liu |
| 8,278,695 B2 | 10/2012 | Kidoh et al. |
| 8,283,205 B2 | 10/2012 | Pagaila et al. |
| 8,288,811 B2 | 10/2012 | Ramaswamy et al. |
| 8,431,456 B2 | 4/2013 | Alapati et al. |
| 8,437,192 B2 | 5/2013 | Lung et al. |
| 8,450,791 B2 | 5/2013 | Alsmeier |
| 8,507,976 B2 | 8/2013 | Joo |
| 8,969,153 B2 | 3/2015 | Lee et al. |
| 9,041,090 B2 | 5/2015 | Simsek-Ege et al. |
| 2003/0201500 A1 | 10/2003 | Furukawa et al. |
| 2005/0200026 A1 | 9/2005 | Liaw |
| 2007/0004140 A1 | 1/2007 | Jang et al. |
| 2007/0004141 A1 | 1/2007 | Kim et al. |
| 2007/0048989 A1 | 3/2007 | Ahn et al. |
| 2008/0009113 A1 | 1/2008 | Shimizu |
| 2008/0179659 A1 | 7/2008 | Enda et al. |
| 2008/0220600 A1 | 9/2008 | Alapati et al. |
| 2009/0117725 A1 | 5/2009 | Sun |
| 2009/0230454 A1 | 9/2009 | Pekny |
| 2009/0289297 A1 | 11/2009 | Kim et al. |
| 2009/0296476 A1 | 12/2009 | Shin et al. |
| 2009/0310425 A1 | 12/2009 | Sim et al. |
| 2010/0155813 A1 | 6/2010 | Murata et al. |
| 2010/0171162 A1 | 7/2010 | Katsumata et al. |
| 2010/0208503 A1 | 8/2010 | Kuo |
| 2010/0258852 A1 | 10/2010 | Lim et al. |
| 2010/0276743 A1 | 11/2010 | Kuniya et al. |
| 2010/0295114 A1 | 11/2010 | Alapati et al. |
| 2011/0019486 A1 | 1/2011 | Jang et al. |
| 2011/0024816 A1 | 2/2011 | Moon et al. |
| 2011/0031550 A1 | 2/2011 | Komori et al. |
| 2011/0032772 A1 | 2/2011 | Aritome |
| 2011/0147823 A1 | 6/2011 | Kuk et al. |
| 2011/0149656 A1 | 6/2011 | Tang et al. |
| 2011/0177661 A1 | 7/2011 | Song et al. |
| 2011/0180865 A1 | 7/2011 | Ramaswamy |
| 2011/0193153 A1 | 8/2011 | Higuchi et al. |
| 2011/0241098 A1 | 10/2011 | Park et al. |
| 2011/0291172 A1 | 12/2011 | Hwang et al. |
| 2011/0316064 A1 | 12/2011 | Kim et al. |
| 2012/0001249 A1 | 1/2012 | Alsmeier et al. |
| 2012/0012921 A1 | 1/2012 | Liu |
| 2012/0068247 A1 | 3/2012 | Lee et al. |
| 2012/0086072 A1 | 4/2012 | Yun et al. |
| 2012/0098050 A1 | 4/2012 | Shim et al. |
| 2012/0119285 A1 | 5/2012 | Yang |
| 2012/0135583 A1 | 5/2012 | Jang et al. |
| 2012/0175697 A1 | 7/2012 | Hall et al. |
| 2012/0184078 A1 | 7/2012 | Kiyotoshi |
| 2012/0193596 A1 | 8/2012 | Nakazawa |
| 2012/0205722 A1 | 8/2012 | Lee et al. |
| 2012/0211822 A1 | 8/2012 | Lim et al. |
| 2012/0211823 A1 | 8/2012 | Lim et al. |
| 2012/0217564 A1 | 8/2012 | Tang et al. |
| 2012/0220088 A1 | 8/2012 | Alsmeier |
| 2012/0231593 A1 | 9/2012 | Joo et al. |
| 2012/0238077 A1 | 9/2012 | Alapati et al. |
| 2012/0241842 A1 | 9/2012 | Matsuda |
| 2012/0329224 A1 | 12/2012 | Kong et al. |
| 2013/0087843 A1 | 4/2013 | Han |
| 2013/0193503 A1 | 8/2013 | Lee et al. |
| 2014/0008714 A1 | 1/2014 | Makala et al. |
| 2014/0131784 A1 | 5/2014 | Davis |
| 2014/0162418 A1 | 6/2014 | Keshav et al. |
| 2014/0191306 A1 | 7/2014 | Hopkins |
| 2014/0191340 A1 | 7/2014 | Thimmegowa et al. |
| 2014/0203344 A1 | 7/2014 | Hopkins et al. |
| 2014/0217488 A1 | 8/2014 | Thimmegowa et al. |
| 2014/0339621 A1 | 11/2014 | Ramaswamy |
| 2014/0339624 A1 | 11/2014 | Ramaswamy |

FOREIGN PATENT DOCUMENTS

| | | |
|---|---|---|
| KR | 10-2012-0113596 | 10/2012 |
| TW | 200845125 | 11/2008 |
| WO | PCT/US2013/063302 | 5/2015 |
| WO | PCT/US2014/011228 | 8/2015 |

OTHER PUBLICATIONS

WO PCT/US2013/063302 Writ. Opin., Jan. 15, 2014, Micron Technology, Inc.
WO PCT/US2014/011228 Search Rept., Apr. 30, 2014, Micron Technology, Inc.
WO PCT/US2014/011228 Writ. Opin., Apr. 30, 2014, Micron Technology, Inc.
TW TW 102138545 Search Rept Trans, Apr. 20, 2015, Micron Technology, Inc.
Wang et al. "Electrical Properties of Crystalline YSZ Films on Silicon as Alternative Gate Dielectrics", Semiconductor Science & Technology 16, 2001, United Kingdom, pp. L13-L16.

METHODS OF FORMING SEMICONDUCTOR CONSTRUCTIONS

RELATED PATENT DATA

This patent resulted from a divisional of U.S. patent application Ser. No. 13/675,933 which was filed Nov. 13, 2012, now U.S. Pat. No. 9,178,077, which is hereby incorporated by reference.

TECHNICAL FIELD

Semiconductor constructions and methods of forming semiconductor constructions.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables the manufacturer to support new communication protocols as they become standardized, and to provide the ability to remotely upgrade the devices for enhanced features.

A typical flash memory comprises a memory array that includes a large number of memory cells arranged in row and column fashion. The flash memory may be erased and reprogrammed in blocks.

NAND may be a basic architecture of flash memory. A NAND comprises at least one selecting device coupled in series to a serial combination of memory cells. Example NAND architecture is described in U.S. Pat. No. 7,898,850.

There is continuing goal to develop improved NAND architectures, and to develop methods of forming such NAND architectures.

BRIEF DESCRIPTION OF THE DRAWINGS

FIGS. 1-19 are diagrammatic cross-sectional views of a semiconductor construction at various process stages of an example embodiment. FIGS. 1, 3, 5, 7, 9, 11, 13, 15 and 17 are top views; FIGS. 2, 4, 6, 8, 10, 12, 14, 16 and 18 are cross-sectional side views along the line X-X of FIGS. 1, 3, 5, 7, 9, 11, 13, 15 and 17, respectively.

DETAILED DESCRIPTION OF THE ILLUSTRATED EMBODIMENTS

In some embodiments, NAND architecture may be fabricated to comprise substantially vertical NAND strings. The fabrication may utilize line and space patterns for formation of channel regions and isolation regions, which can advantageously avoid difficulties encountered in conventional NAND fabrication processes utilizing pillars (or other high aspect ratio contacts) to support channel regions. In some embodiments, new NAND architectures may result from processes described herein. Although NAND architectures are described in some example embodiments presented herein, in other embodiments processing described herein may be utilized for fabrication of other memory, such as, for example, NOR, etc. Some example embodiments are described with reference to FIGS. 1-19.

Figure 1:
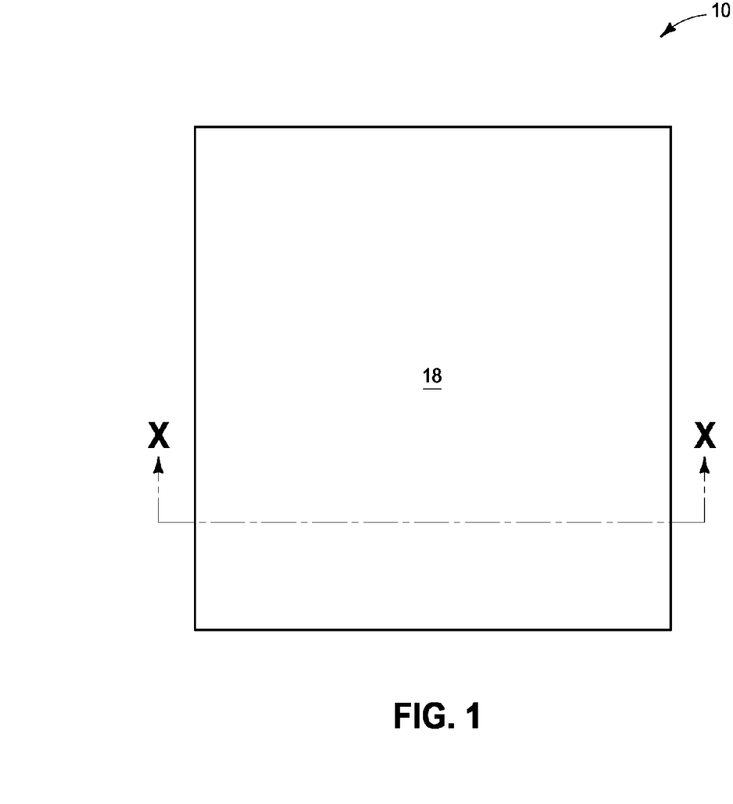
Figure 2:
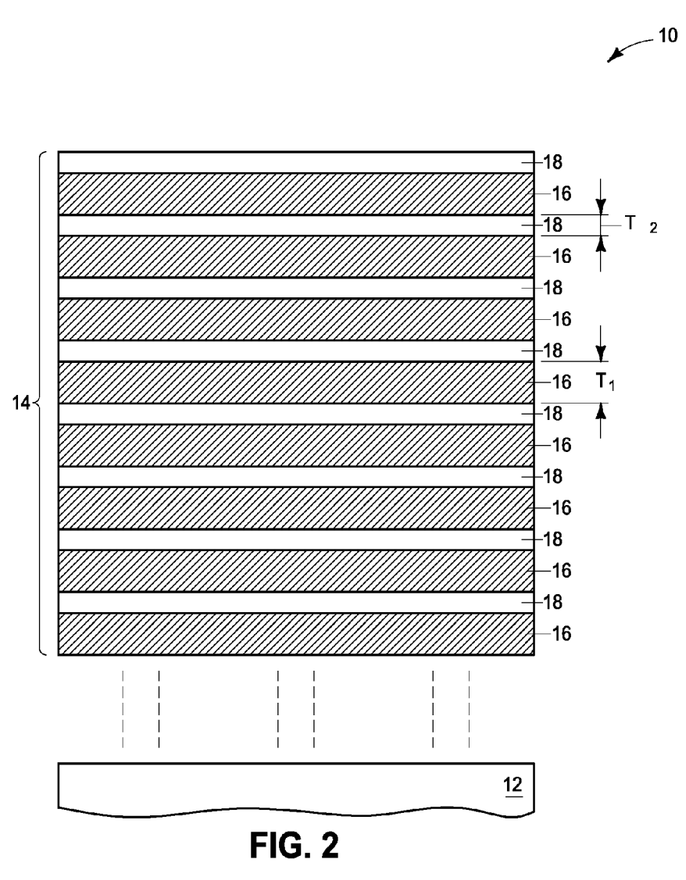

Referring to FIGS. 1 and 2, a semiconductor construction 10 is shown in top view (FIG. 1) and cross-sectional side view (FIG. 2).

The construction 10 includes a stack 14 supported by a base 12. Stack 14 comprises alternating levels (e.g., sheets, layers, etc.) of control gate material 16 and intervening dielectric material 18. Dashed lines are provided between the stack 14 and the base 12 to indicate that there may be additional materials and/or integrated circuit structures between the base and the stack in some embodiments.

The base 12 may comprise semiconductor material, and in some embodiments may comprise, consist essentially of, or consist of monocrystalline silicon. In some embodiments, base 12 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 12 may correspond to a semiconductor substrate containing one or more materials associated with integrated circuit fabrication. Such materials may include, for example, one or more of refractory metal materials, barrier materials, diffusion materials, insulator materials, etc.

Control gate material 16 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). For instance, in some embodiments the control gate material 16 may comprise, consist essentially of, or consist of conductively-doped silicon; such as, for example, n-type doped polycrystalline silicon.

The intervening dielectric material 18 may comprise any suitable composition; and in some embodiments may comprise, consist essentially of, or consist of silicon dioxide.

The levels of control gate material 16 may be of any suitable thickness ($T_1$), and in some embodiments may have a thickness within a range of from about 5 nm to about 300 nm. The levels of intervening dielectric material 18 may be of any suitable thickness ($T_2$), and in some embodiments may have a thickness within a range of from about 5 nm to about 200 nm.

The example processing described herein forms vertical NAND strings, with the number of memory cells in each string been determined by the number of control gate levels. The shown example embodiment has eight levels of control gate material 16. Other embodiments may have more or less than the shown eight levels. Accordingly, other example embodiments may have a stack with a total of 16 control gate levels, 32 control gate levels, 64 control gate levels, etc.

Figure 3:
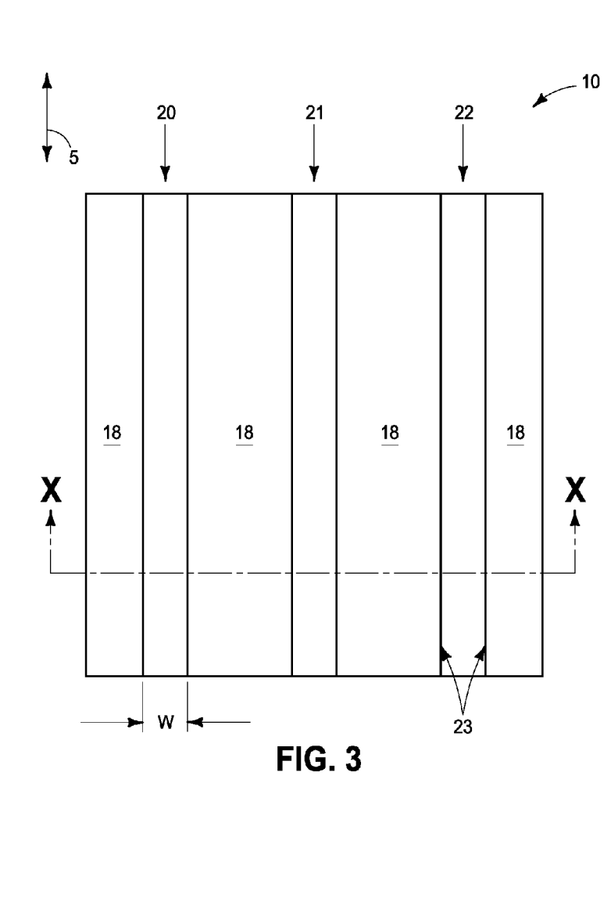
Figure 4:
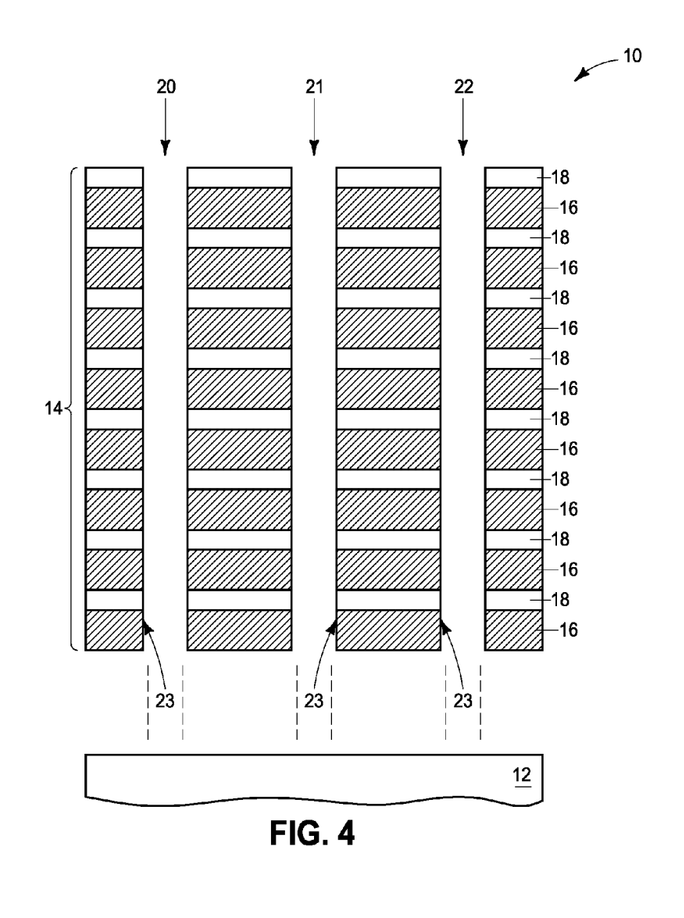

Referring next to FIGS. 3 and 4, the stack 14 is etched to form a plurality of first trenches 20-22 within the stack. The first trenches extend along a first direction of an axis 5, as shown in the top view of FIG. 3. In the shown embodiment, the first trenches are configured as lines extending along the axis 5. In other embodiments, the first trenches may form structures which are curved or wavy along axis 5, rather than being straight lines, but may still extend primarily along the direction of axis 5. The first trenches 20-22 may have any suitable widths (W), and in some embodiments may have widths within a range of from about 5 nm to about 100 nm.

The trenches 20-22 may be formed with any suitable processing. For instance, a mask (not shown) may be formed across a top of construction 10 to define locations of the trenches, and then one or more suitable etches may be utilized to pattern the trenches through stack 14 (in some example embodiments, the etching used to form trenches 20-22 may utilize one or more of $NF_3$, $CH_2F_2$, HBr and $BCl_3$). Subsequently, the patterned mask may be removed to leave the illustrated construction of FIGS. 3 and 4. The patterned mask may comprise any suitable material and may be formed utilizing any suitable processing. For instance, the patterned mask may comprise photolithographically-patterned photoresist and/or the patterned mask may comprise material patterned through a pitch-multiplication process.

The trenches 20-22 may be considered to comprise interior walls 23 (only some of which are labeled) which extend along the materials 16 and 18 of stack 14.

Figure 5:
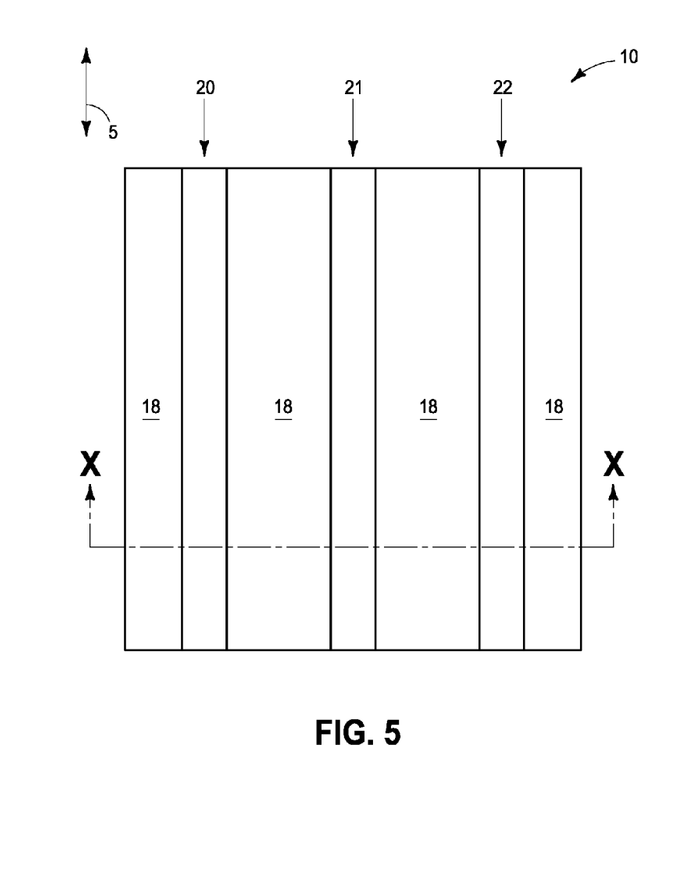
Figure 6:
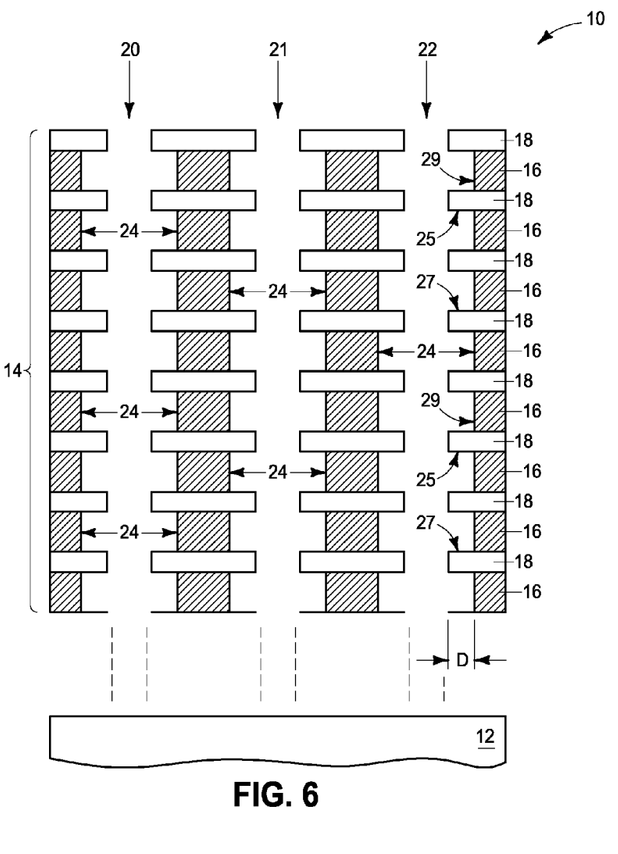

Referring next to FIGS. 5 and 6, the control gate material 16 is recessed along the interior walls of trenches 20-22 to form a plurality of cavities 24 (only some of which are labeled). The individual cavities are bounded on top and bottom by intervening dielectric material 18, and are bounded along one side by control gate material 16. For instance, some of the cavities have the tops and bottoms labeled as 25 and 27, respectively; and some of the cavities have the side bounded by the control gate material labeled as 29.

The cavities may be recessed to any suitable distance (D) into the control gate material 16, and in some embodiments may be recessed to a distance within a range of from about 5 nm to about 100 nm.

Figure 7:
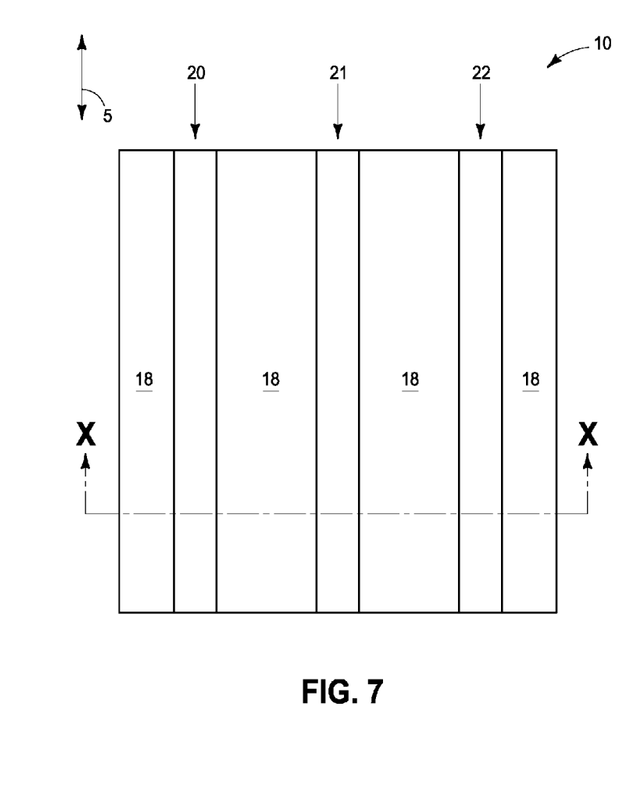
Figure 8:
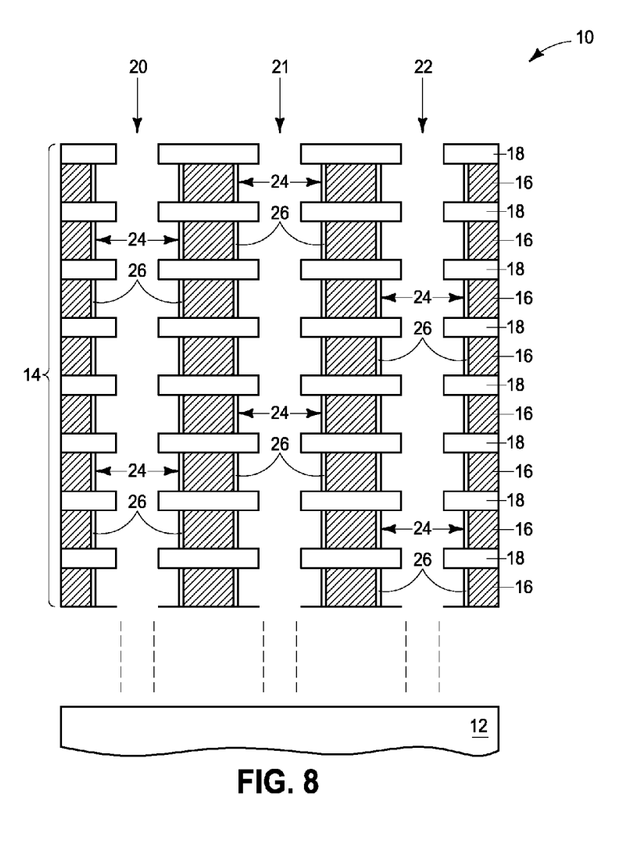

Referring to FIGS. 7 and 8, cell dielectric material 26 (only some of which is labeled) is formed within cavities 24 along exposed edges of control gate material 16. The cell dielectric material 26 may be referred to as a first cell dielectric material to distinguish it from other cell dielectric materials that are subsequently formed (discussed below).

The cell dielectric material 26 may comprise any suitable composition or combination of compositions; and in some embodiments may comprise, consist essentially of, or consist of silicon dioxide. Such silicon dioxide may be thermally grown from silicon of control gate material 16 in embodiments in which the control gate material comprises, consists essentially of, or consists of silicon. Alternatively, or additionally, at least some of the cell dielectric material may be deposited.

The cell dielectric 26 may be formed to any suitable thickness, and in some example embodiments may be formed to a thickness within a range of from about 10 Å to about 200 Å.

Figure 9:
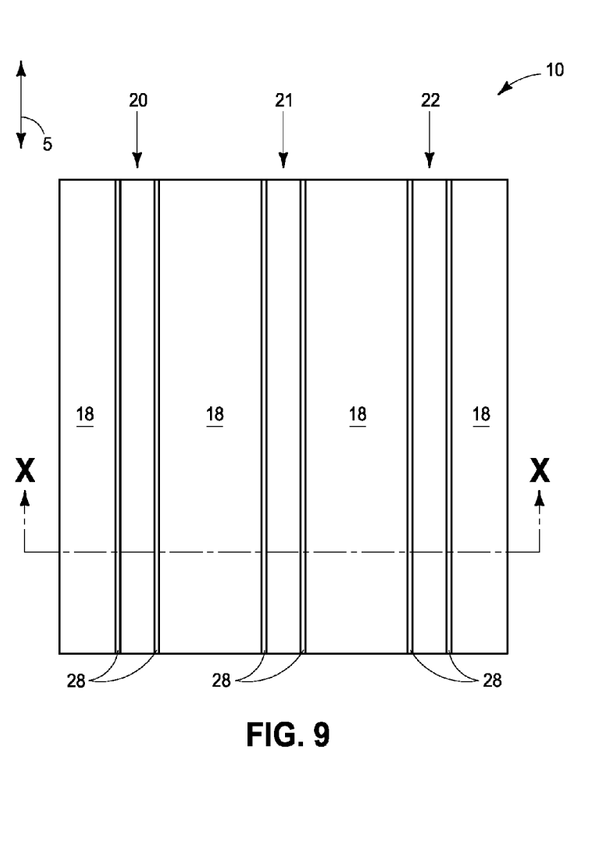
Figure 10:
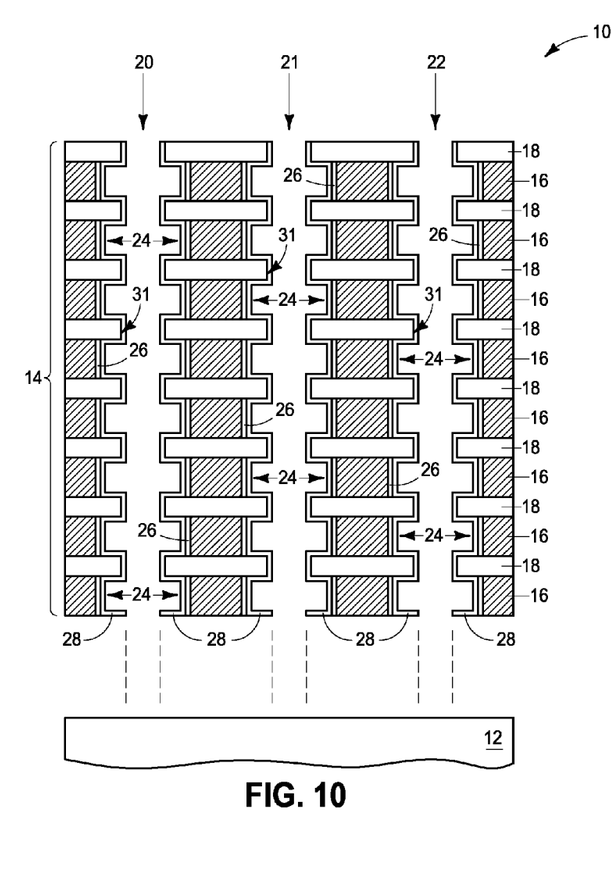

Referring to FIGS. 9 and 10, second cell dielectric material 28 (only some of which is labeled) is formed directly adjacent the first cell dielectric material 26. The second cell dielectric material within cavities 24 may be considered to be shaped as containers having open ends pointing away from the adjacent first cell dielectric material 26.

The second cell dielectric material 28 may comprise any suitable composition or combination of compositions; and in some embodiments may comprise, consist essentially of, or consist of silicon nitride.

The second cell dielectric material may be formed utilizing any suitable processing, such as, for example, one or more of atomic layer deposition (ALD), chemical vapor deposition (CVD) and physical vapor deposition (PVD). It may be advantageous that the second cell dielectric material be formed conformally, as shown, and thus it may be advantageous to utilize ALD for forming such material in some embodiments.

In the shown embodiment, the intervening dielectric material 18 has surfaces 31 (only some of which are labeled) along trenches 20-22. The second cell dielectric 28 extends within cavities 24, and along surfaces 31 of dielectric material 18. In other embodiments (not shown) material 28 be removed from surfaces 31 with an appropriate etch following formation of material 28 within cavities 24.

Material 28 may be formed to any suitable thickness, and in some example embodiments may be formed to a thickness within a range of from about 50 Å to about 200 Å.

Figure 11:
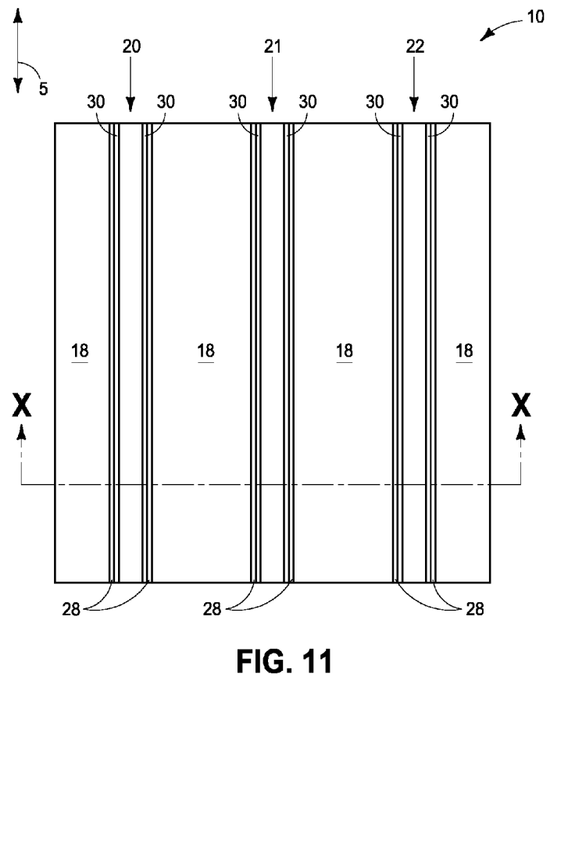
Figure 12:
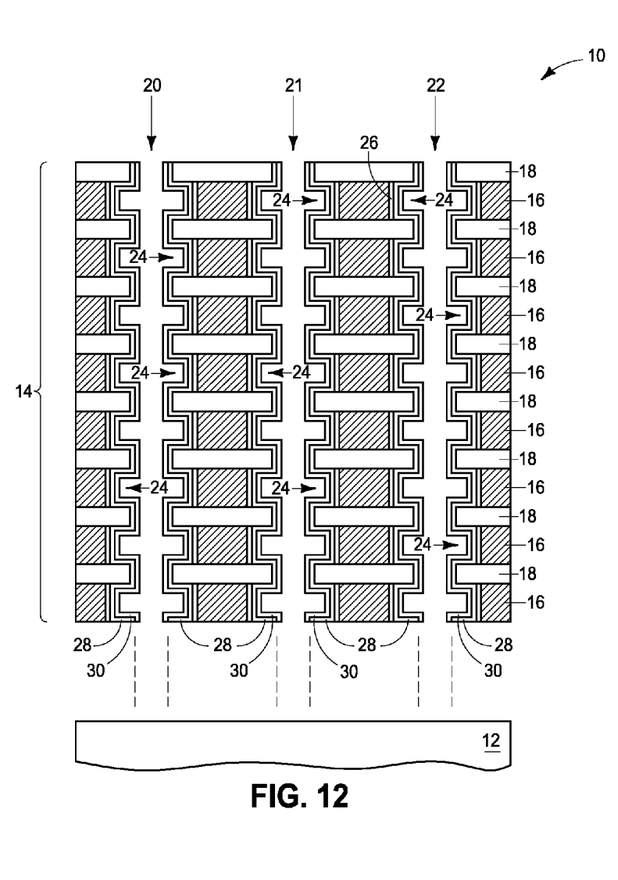

Referring to FIGS. 11 and 12, a third cell dielectric 30 (only some of which is labeled) is formed within the containers defined by the second cell dielectric 28. In some embodiments, the second cell dielectric material 28 may comprise, consist essentially of, or consist of silicon nitride; and the third cell dielectric 30 may comprise, consist essentially of, or consist of silicon dioxide. In some embodiments, the first and third cell dielectrics 26 and 30 may comprise the same composition as one another; and may, for example, both comprise, consist essentially of, or consist of silicon dioxide. In some embodiments, the third cell dielectric may be thermally grown from the silicon nitride, and/or may be deposited over the silicon nitride.

The third cell dielectric 30 may comprise any suitable thickness, and in some example embodiments may be formed to a thickness within a range of from about 10 Å to about 100 Å.

Figure 13:
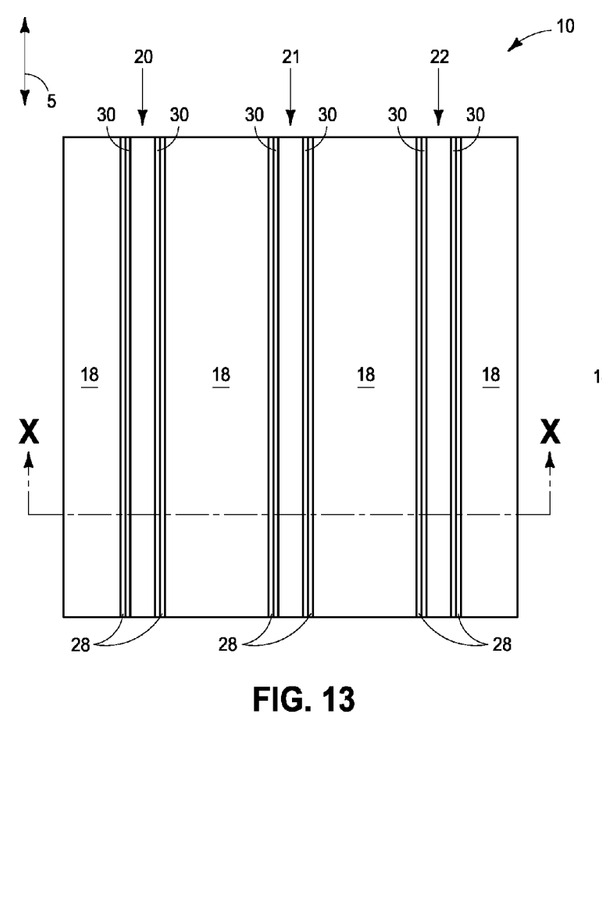
Figure 14:
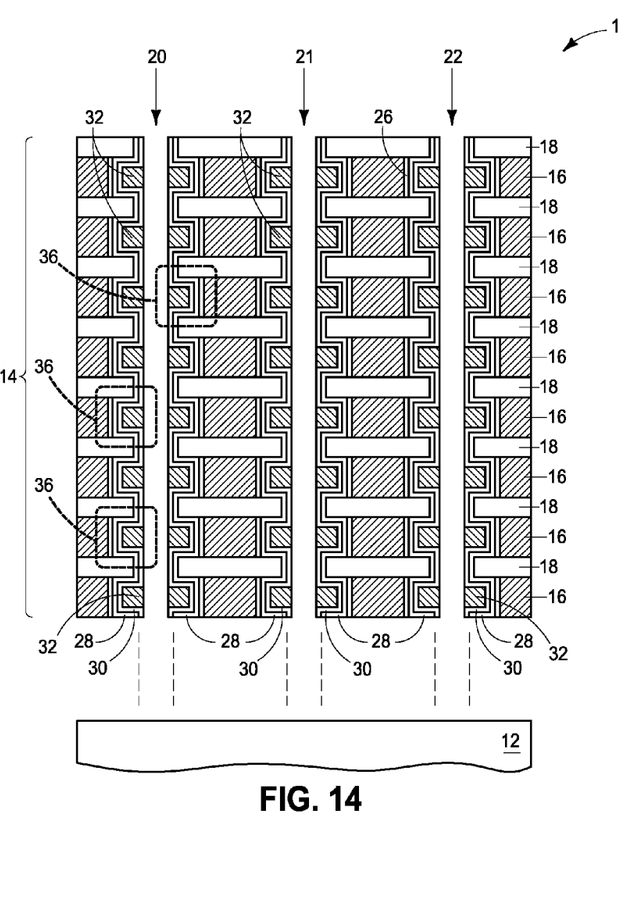

Referring to FIGS. 13 and 14, charge-storage material 32 (only some of which is labeled) is formed within the containers defined by material 28, and directly against material 30 in the shown embodiment. In some embodiments, the third cell dielectric 30 may be considered to partially fill the containers defined by the second cell dielectric 28, and the charge-storage material 32 may be considered to be formed within such partially-filled containers.

The charge-storage material may comprise any material suitable for retaining charge in memory cells. In some example embodiments, the charge-storage material may comprise, consist essentially of, or consist of appropriately-doped polycrystalline silicon, and may thus be utilized to form floating gates of memory cells. In some example embodiments, the charge-storage material may comprise charge-trapping material, such as, for example, silicon nitride, silicon oxynitride, conductive nanodots, etc.

The cell dielectrics 26, 28 and 30, together with the charge-storage material 32, form memory cell stacks 36 (only some of which are labeled) within the cavities 24 (the cavities are labeled in previous figures, such as, for example, FIG. 6). Although the shown embodiment utilizes three cell dielectrics within the memory cell stacks, in other embodiments other numbers of cell dielectrics may be used. Generally, there will be at least one cell dielectric.

Figure 15:
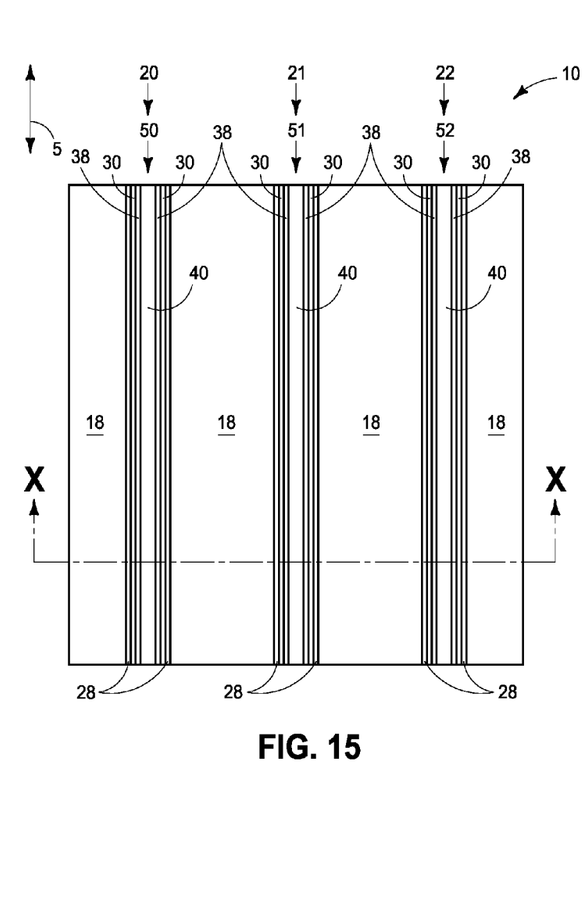
Figure 16:
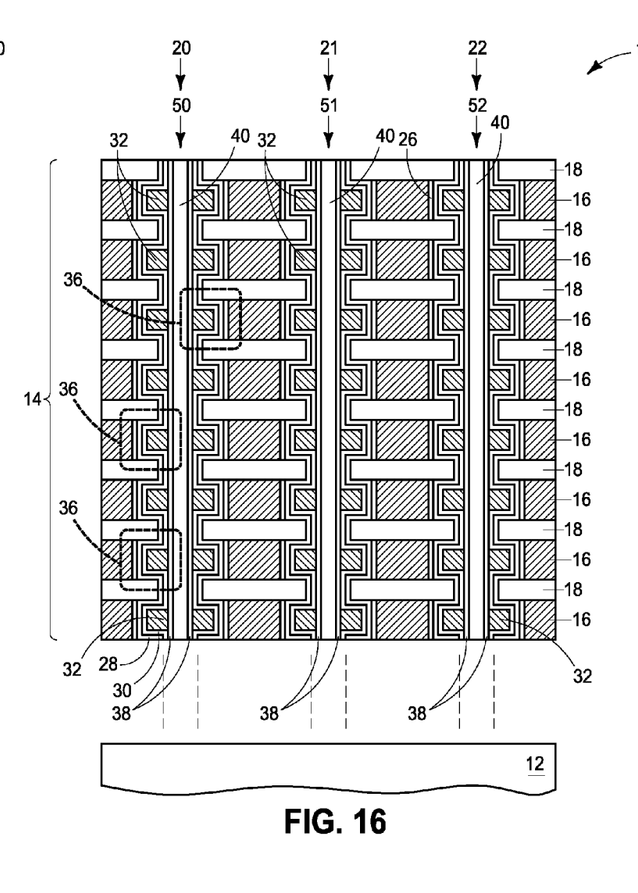

Referring to FIGS. 15 and 16, gate dielectric material 38 is formed along interior sidewalls of the trenches 20-22, and then channel material 40 is formed within such trenches.

The gate dielectric material 38 may comprise any suitable composition or combination of compositions; and in some embodiments may comprise, consist essentially of, or consist of one or more of silicon dioxide, tantalum aluminum oxide, hafnium oxide, zirconium oxide, etc. In some embodiments, the gate dielectric material may comprise a same composition as cell dielectric 26. For example, in some embodiments the gate dielectric 38 and the cell dielectric 26 may each comprise, consist essentially of, or consist of silicon dioxide.

The gate dielectric material 38 may be formed with any suitable processing including, for example, one or more of ALD, CVD and PVD. The gate dielectric material may be formed to any suitable thickness, including, for example, a thickness within a range of from about 10 Å to about 50 Å. In the shown embodiment, the gate dielectric material extends across the open ends of the containers defined by material 28, and extends across the charge-storage material 32.

In some embodiments, the charge-storage material 32 comprises silicon, and the gate dielectric material 38 comprises silicon dioxide formed by thermal oxidation of such silicon. In such embodiments, the gate dielectric material may be only along surfaces of material 32, rather than entirely along the sidewalls of the trenches.

The channel material 40 may comprise any suitable composition or combination of compositions; and in some embodiments may comprise, consist essentially of, or consist of appropriately-doped silicon (e.g., conductively-doped polysilicon). The channel material may be formed with any suitable processing, including, for example, one or more of ALD, CVD and PVD.

The channel material 40 may be considered to form panels 50-52 within the trenches 20-22, respectively. Such channel material panels extend along the direction of axis 5. In some embodiments, the channel material panels may be considered to divide stack 14 into sections. Each channel panel may form a first section on a first side of the channel panel, and a second section on a second side of the channel panel, with the second side being in opposing relation to the first side.

Figure 17:
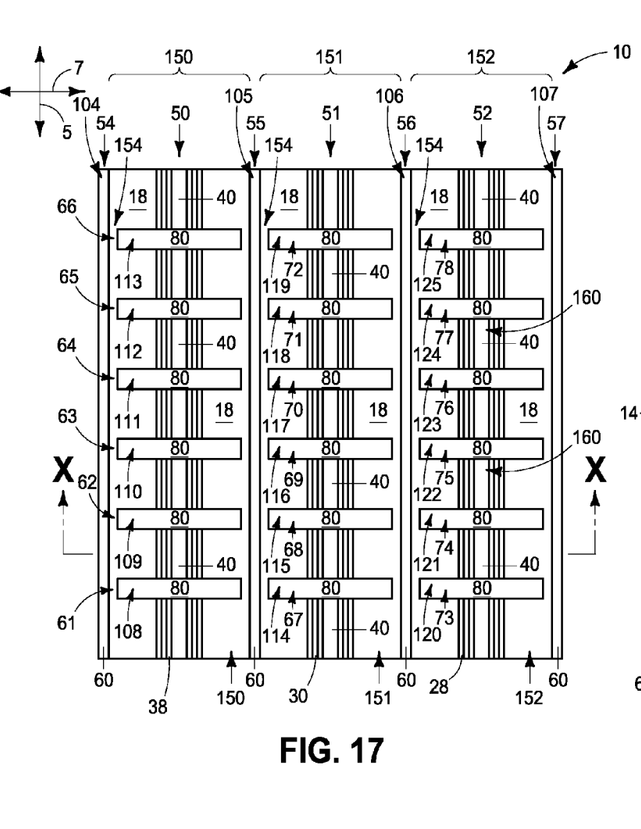
Figure 18:
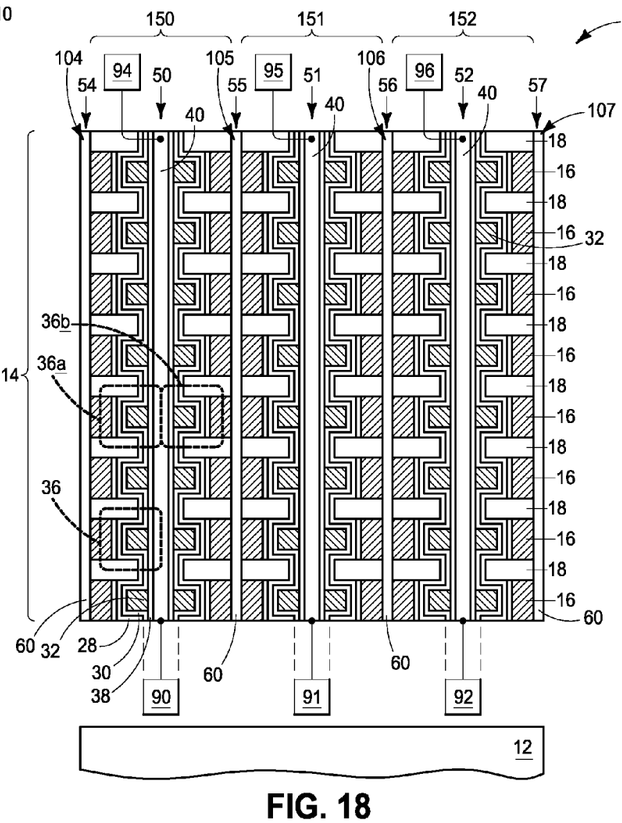

Referring to FIGS. 17 and 18, a plurality of second trenches 54-57 are formed within the stack 14, and extend along the direction of axis 5 as shown in the top view of FIG. 17. The trenches 54-57 may be formed with any suitable processing, including, for example, processing analogous to that described above with reference to FIGS. 3 and for fabrication of the first trenches 20-22. Accordingly, in some embodiments a patterned mask (not shown) may be formed over stack 14, a pattern transferred from the patterned mask into the stack 14 to form the trenches 54-57, and then the mask may be removed.

The second trenches are filled with dielectric material 60. Such dielectric material may comprise any suitable composition or combination of compositions; and in some embodiments may comprise, consist essentially of, or consist of silicon dioxide. The dielectric material 60 may be considered to form dielectric material panels 104-107 within the trenches 54-57.

FIGS. 17 and 18 also show a plurality of third trenches 61-78 formed within stack 14 and channel material 40. The third trenches extend along an axis 7 which is substantially orthogonal to the axis 5 in the shown embodiment; with the term "substantially orthogonal" meaning that the axes 5 and 7 are orthogonal to within reasonable tolerances of fabrication and measurement. The trenches 61-78 may be formed with any suitable processing, including, for example, processing analogous to that described above with reference to FIGS. 3 and 4 for fabrication of the first trenches 20-22. Accordingly, in some embodiments a patterned mask (not shown) may be formed over stack 14, a pattern transferred from the patterned mask into the stack 14 and channel material 40 to form the trenches 61-78, and then the mask may be removed.

The third trenches are filled with dielectric material 80. Such dielectric material may comprise a suitable composition or combination of compositions; and in some embodiments may comprise, consist essentially of, or consist of silicon dioxide. The dielectric material 80 may be considered to form dielectric material panels 108-125 within the trenches 61-78. In some embodiments, the dielectric material panels 104-107 may be referred to as first dielectric material panels, and the dielectric material panels 108-125 may be referred to as second dielectric material panels.

In the shown embodiment, the second dielectric material panels are thicker than the first dielectric material panels. In other embodiments, the first and second dielectric material panels may be the same thicknesses as one another, or the first dielectric material panels may be thicker than the second dielectric material panels.

In some embodiments, the trenches 54-57 may be formed prior to the trenches 61-78; in other embodiments the trenches 61-78 may be formed prior to the trenches 54-57; and in yet other embodiments the trenches 61-78 may be formed simultaneously with the trenches 54-57. Further, in some embodiments the trenches 54-57 may be filled with dielectric material 60 prior to filling the trenches 61-78 (and even prior to forming the trenches 61-78 in some embodiments); in other embodiments the trenches 61-78 may be filled with dielectric material 80 prior to filling the trenches 54-57 (and even prior to forming the trenches 54-57 in some embodiments); and in some embodiments the trenches 54-57 may be filled simultaneously with the filling of the trenches 61-78. In embodiments in which the trenches 54-57 are filled simultaneously with the trenches 61-78, all of the trenches 54-57 and 61-78 may be filled with the same material as one another. In such embodiments, the material filling trenches 54-57 and 61-78 may, for example, comprise, consist essentially of, or consist of silicon dioxide.

Although the shown embodiment has the trenches 20-22 formed and filled with channel material prior to forming and filling the second trenches 54-57; in other embodiments, the trenches 54-57 may be formed and filled prior to forming and filling the trenches 20-22. In such other embodiments, the dielectric material panels 104-107 may be considered to be formed prior to the channel material panels 50-52.

In some embodiments, the first dielectric material panels 104-107 may be considered to divide stack 14 into a plurality of slices 150-152, with the individual slices extending along a first direction defined by axis 5 (as shown in the top view of FIG. 17). In such embodiments, the channel material panels 50-52 may be considered to extend along such first direction. The channel material panels 50-52 extend approximately along the center of each slice 150-152 in the shown embodiment.

The second dielectric material panels 108-125 extend along a second direction defined by axis 7, with such second direction being substantially orthogonal to the first direction of axis 5. The second dielectric material panels 108-125 are in a many-to-one correspondence with each of slices 150-152. The second dielectric material panels 108-125 extend through the channel material panels, but only extend partially across the slices so that there are regions 154 of the slices (labeled in FIG. 17, with only some of regions 154 being labeled) that are on either edge of the second dielectric material panels 108-125 between the second dielectric material panel edges and the first dielectric material panels 54-57. The regions 154 enable all of the control gate material within the same level and the same slice (for example, the top level within the slice 150) to be electrically coupled as a continuous unit.

The dielectric material panels 108-125 divide the channel material panels 50-52 into a plurality of segments 160 (labeled in FIG. 17, with only some of the segments 160 being labeled). Such segments are incorporated into vertical NAND strings, as shown along the cross-section of FIG. 18. Each NAND string has a plurality of memory cell stacks 36 (only some of which are labeled) extending vertically from the bottom of stack 14 to the top of stack 14. Further, the cross-section of FIG. 18 shows that source regions of select gates 90-92 may be coupled to the bottoms of the vertical NAND strings, and that drain regions of select gates 94-96 may be coupled to the tops of the vertical NAND strings. The illustrated embodiment is one of many embodiments, and the various relations of select gates and strings could be flipped in other embodiments, or alternated along axis 7.

The memory cell stacks 36 are between the control gate material 16 and the channel material 40, with the memory cell stacks being incorporated into memory cells formed along the levels of the control gate material 16. In some embodiments, memory cell stacks may be considered to be paired across a channel region. For instance, two memory cell stacks are labeled as cell stacks 36a and 36b in FIG. 18, with such cell stacks being on opposing sides of the channel material panel 50 relative to one another.

In some embodiments, memory cell stack 36a may be part of a different string of memory cells than memory cell stack 36b, and in other embodiments the memory cell stacks 36a and 36b may be part of the same memory cell string as one another. For instance, in some embodiments memory cell stack 36a may be part of a memory cell string which includes only the memory cells directly above and directly below the stack 36a; and memory cell stack 36b may be part of a memory cell string which includes only the memory cells directly above and below the stack 36b. Thus, the portion of the channel material panel 50 shown in FIG. 18 separates two different memory cell strings (e.g., NAND strings) from one another, but is a common channel for both of such memory cell strings. In the shown aspect of such embodiment, there are 48 individual memory cell stacks 36 in the cross-section of FIG. 18, with each of the shown portions of channel material panels 50-52 separating a set of eight memory cell stacks from another set of eight memory cell stacks (for instance, panel 50 separates the set comprising memory cell stack 36a from the set comprising memory cell stack 36b), but being a common channel for both of the sets.

As another example, in some embodiments the memory cell stacks 36 at a common level along a channel are electrically coupled to one another and are thereby paired to form a single memory cell (e.g., a NAND memory cell) from two adjacent memory cell stacks. Thus, memory cell stacks 36a and 36b may be part of a single memory cell in some embodiments. Such embodiments may comprise ohmically connecting charge-storage material 32 on one side of a channel material panel with charge-storage material on an opposing side of the channel material panel; such as, for example, ohmically connecting charge-storage material of memory stack 36a with charge-storage material of memory stack 36b.

Regardless of whether adjacent cell stacks are coupled to one another to form a single memory cell or not, the charge storage materials 32 of the memory cells described above may comprise floating gates or charge-trapping materials; and thus the memory cells may, for example, correspond to SONOS configurations, TaNOS configurations, etc.

Figure 19:
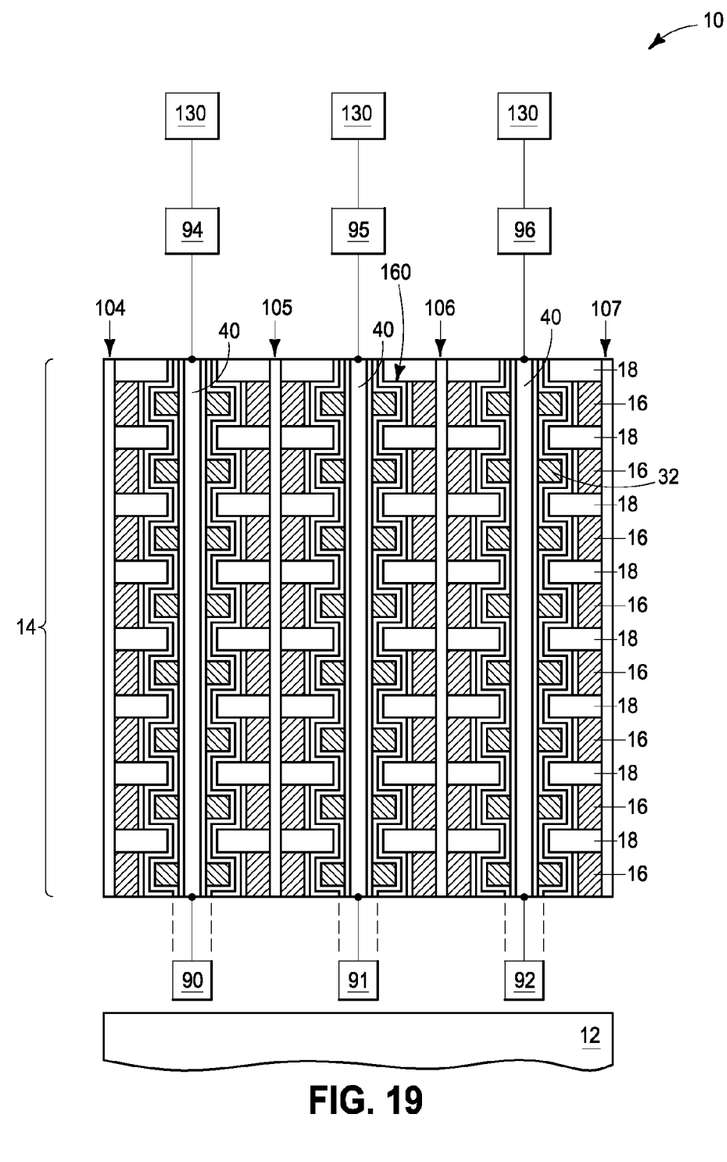
FIG. 19 is a diagrammatic cross-sectional view of the construction of FIG. 18 shown at a process stage subsequent to that of FIG. 18.

Referring to FIG. 19, the various structures of construction 10 may be incorporated into an integrated circuit by forming electrically conductive contacts 130 adjacent the select gates 94-96 to connect such select gates to other circuitry (not shown). Such other circuitry may be utilized for reading and writing of information from and to the NAND array. Other contacts (not shown) may be formed to electrically couple other structural components of FIG. 19 with other integrated circuitry (not shown). For instance, the control gate material 16 associated with the various levels of the NAND strings within the slices 150-152 (FIGS. 17 and 18) may be electrically coupled to other circuitry to enable the various memory cells within each of the slices 150-152 to be programmed and/or block-erased; and select gates 90-92 may be electrically coupled to other circuitry (not shown).

The memory discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a semiconductor construction which comprises a stack containing alternating levels of control gate material and intervening dielectric material. A channel material panel extends through the stack along a first direction. The channel material panel divides the stack into a first section on a first side of the channel material panel and a second section on a second side of the channel material panel. The second side is in opposing relation to the first side. Memory cell stacks are between the channel material panel and the control gate material on both sides of the channel material panel. The memory cell stacks comprise cell dielectric material shaped as containers having open ends pointing toward the channel material panel, and comprise charge-storage material within the containers. Electrically insulative panels extend through the channel material panel and the stack, and sub-divide the channel material panel into a plurality of segments. The channel material panel extends along a first direction, and the electrically insulative panels extend along a second direction substantially orthogonal to the first direction.

Some embodiments include a semiconductor construction which comprises a stack containing alternating control gate material and intervening dielectric material. First dielectric material panels extend through the stack. The first dielectric material panels divide the stack into a plurality of slices which extend along a first direction. Channel material panels extend along the first direction. Individual channel material panels extend approximately along a center of each slice. A plurality of second dielectric material panels extend through the stack and along a second direction substantially orthogonal to the first direction. The second dielectric material panels are in a many-to-one correspondence with each slice, extend through the channel material panels, and extend only partially across the slices. Memory cell stacks are between the channel material panels and the control gate material. The memory cell stacks comprise cell dielectric material shaped as containers having open ends pointing toward the channel material panels, and comprise charge-storage material within the containers.

Some embodiments include a method of forming a semiconductor construction. A stack is formed, with the stack comprising alternating control gate material and intervening dielectric material. First trenches are formed within the stack and such first trenches extend along a first direction. The control gate material is recessed along interior walls of the first trenches to form a plurality of cavities along the interior walls. The cavities are bounded on top and bottom by the intervening dielectric material, and on one side by the control gate material. Memory cell stacks are formed within the cavities. The memory cell stacks comprise cell dielectric material shaped as containers and having open ends pointing away from the sides of the cavities bounded by the control gate material. The memory cell stacks also comprise charge-storage material within the containers. After the memory cell stacks are formed, channel material panels are formed within the first trenches. The channel material panels extend along the first direction of the first trenches. Second trenches are formed within the stack and extend along the first direction. First dielectric material panels are formed within the second trenches. Third trenches are formed within the stack and channel material panels, with the third trenches extending along a second direction substantially orthogonal to the first direction. Second dielectric material panels are formed within the third trenches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a semiconductor construction, comprising:
    forming a stack comprising alternating control gate material and intervening dielectric material;
    forming a plurality of first trenches within the stack and extending along a first direction;
    recessing the control gate material along interior walls of the first trenches to form a plurality of cavities along the interior walls, the cavities being bounded on top and bottom by the intervening dielectric material, and on one side by the control gate material;
    forming memory cell stacks within the cavities, the memory cell stacks comprising cell dielectric material shaped as containers and having open ends pointing away from the sides of the cavities bounded by the control gate material; the memory cell stacks also comprising charge-storage material within the containers;
    after forming the memory cell stacks, forming channel material panels within the first trenches; the channel material panels extending along the first direction of the first trenches;
    forming a plurality of second trenches within the stack and extending along the first direction;
    forming first dielectric material panels within the second trenches;
    forming form a plurality of third trenches within the stack and channel material panels, and extending along a second direction substantially orthogonal to the first direction; and
    forming a plurality of second dielectric material panels within the third trenches.

2. The method of claim 1 wherein the cell dielectric material is second cell dielectric material, and wherein the memory cell stacks comprise first cell dielectric material directly against the control gate material and comprise the second cell dielectric material adjacent the first cell dielectric material.

3. The method of claim 1 wherein the first dielectric material panels are formed after the channel material panels.

4. The method of claim 1 wherein the first dielectric material panels are formed before the channel material panels.

5. The method of claim 1 wherein the second dielectric material panels are formed after the first dielectric material panels.

6. The method of claim 5 wherein adjacent first dielectric material panels are spaced from one another by a distance, and wherein the second dielectric material panels extend only a portion of said distance.

7. The method of claim 1 wherein the second dielectric material panels are formed before the first dielectric material panels.

8. The method of claim 1 wherein the second dielectric material panels are formed simultaneously with the first dielectric material panels.

9. The method of claim 1 wherein the charge-storage material is floating gate material.

10. The method of claim 1 wherein the charge-storage material is charge-trapping material.

11. The method of claim 1 wherein the third trenches are formed simultaneously with the second trenches.

12. The method of claim 1 wherein the third trenches are formed before the second trenches.

13. The method of claim 1 wherein the third trenches are formed after the second trenches.

14. A method of forming a semiconductor construction, comprising:
    forming a stack comprising alternating control gate material and intervening dielectric material;
    forming a plurality of first trenches within the stack and extending along a first direction;
    recessing the control gate material along interior walls of the first trenches to form a plurality of cavities along the interior walls, the cavities being bounded on top and bottom by the intervening dielectric material, and on one side by the control gate material;
    forming memory cell stacks within the cavities, the memory cell stacks comprising cell dielectric material shaped as containers and having open ends pointing away from the sides of the cavities bounded by the control gate material; the memory cell stacks also comprising charge-storage material within the containers;
    after forming the memory cell stacks, forming rectangular panels of channel material within the first trenches; the channel material panels extending along the first direction of the first trenches, the rectangular panels having a width and having the channel material extending an entirety of the width;

forming a plurality of second trenches within the stack and extending along the first direction;

forming first dielectric material panels within the second trenches.

15. The method of claim 14 further comprising ohmically coupling charge-storage material along a first side of the rectangular panel with charge storage material along a second side of the rectangular panel.

16. A method of forming a semiconductor construction, comprising:

forming a stack comprising alternating levels of control gate material and intervening dielectric material;

forming a rectangular channel material panel extending through the stack and along a first direction; the rectangular channel material panel dividing the stack into a first section on a first side of the rectangular channel material panel and a second section on a second side of the rectangular channel material panel, the rectangular channel material panel having a thickness between the first and second sides and having channel material throughout the thickness; the second side being in opposing relation to the first side;

forming memory cell stacks between the rectangular channel material panel and the control gate material on both sides of the rectangular channel material panel; the memory cell stacks comprising cell dielectric material shaped as containers having open ends that open toward the rectangular channel material panel, and comprising charge-storage material within the containers; and forming a plurality of rectangular electrically insulative panels extending through the rectangular channel material panel and the stack, and sub-dividing the rectangular channel material panel into a plurality of segments; the rectangular channel material panel extending along a first direction, and the rectangular electrically insulative panels extending along a second direction substantially orthogonal to the first direction.

17. The method of claim 16 wherein the memory cell stacks are incorporated into two strings of memory cells that extend vertically through the stack on opposing sides of the rectangular channel material panel from one another.

18. The method of claim 16 further comprising ohmically coupling charge-storage material along the first side of the rectangular channel material panel with charge-storage material along the second side of the rectangular channel material panel so that memory cell stacks on opposing sides of the rectangular channel material panel are incorporated into a single string of memory cells that extends vertically through the stack.

19. The method of claim 16 wherein the cell dielectric material is second cell dielectric material, and wherein the memory cell stacks comprise:

first cell dielectric material along the control gate material;
the second cell dielectric along the first cell dielectric material; and
gate dielectric material across the container open ends and across the charge-storage material.

20. The method of claim 16 wherein the cell dielectric material is second cell dielectric material, and wherein the memory cell stacks comprise:

first cell dielectric material along the control gate material;
the second cell dielectric along the first cell dielectric material;
third cell dielectric material within the containers and partially filling the containers;
the charge-storage material within the partially filled containers; and
gate dielectric material across the container open ends and across the charge-storage material.

* * * * *